Aug. 31, 1965 D. R. LANCE 3,204,199

SOLID STATE MICROWAVE SOURCE UTILIZING THREE TUNING MEANS

Filed Feb. 17, 1964 2 Sheets-Sheet 1

DREW LANCE
INVENTOR.

BY Roger S. Borovoy
ATTORNEY

DREW LANCE
INVENTOR.
BY Roger S. Borovoy
ATTORNEY 3,204,199

SOLID STATE MICROWAVE SOURCE UTILIZING THREE TUNING MEANS

Drew R. Lance, San Jose, Calif., assignor to Fairchild Camera and Instrument Corporation, Syosset, N.Y., a corporation of Delaware Filed Feb. 17, 1964, Ser. No. 345,264
7 Claims. (Cl. 331—117)

This invention relates to a solid state microwave generator. More particularly, the invention relates to a microwave generator using a single transistor to achieve both multiplication and oscillation. The application of a D.-C. operating voltage to the microwave generator of this invention provides a substantial power output at a desired multiple of a predetermined frequency.

In the past, solid state microwave generators required two essential components. The first was an oscillator, such as a transistor oscillator, providing a power output at a predetermined frequency. This power output was then passed through a varactor diode or several varactor diodes which acted as a multiplier. The output power derived from the varactor diodes was an integral multiple of the power output from the transistor oscillator.

The transistor-varactor microwave generators of the prior art invariably had certain problems encountered in the interface between the transistor oscillator and the varactor diode. A good impedance match between the transistor and the diode was invariably difficult to achieve, and a good impedance match between two varactor diode multipliers was even more difficult to achieve. A slight mismatch caused an appreciable loss of power within the generator and in some cases parametric oscillations at spurious frequencies. Even if an acceptable impedance match could be obtained between the transistor and varactor diode at a given temperature, small temperature variations would change the device characteristics and cause misalignment of critically tuned circuits. Moreover, difficulties were often encountered in starting the oscillation cycle.

Another problem arose in the prior art microwave generators from the appearance of undesired harmonics of the above-mentioned first predetermined frequency. Because of the high order of multiplication following the transistor, the undesired frequency multiples were in close proximity to the desired output frequency. Substantial filtering was required to reduce the unwanted frequency components to an acceptable level. Because of mixing products that occur in multiplier choices, the level of filtering required is one to two orders of magnitude greater than the desired attenuation of the unwanted harmonics. However, if the first frequency were not filtered out, harmonics appeared in the final multiplied signal which interfered with the signal and caused undesirable side bands.

The solid state microwave generator of this invention uses a single transistor both for oscillation and multiplication. The use of such a single device overcomes all the interface problems encountered in the prior art where a transistor was used for oscillation and a varactor diode for multiplication. Since the output power from the generator of this invention is at the multiplied frequency, there are no mixer products and power at the first predetermined (unmultiplied) frequency may be filtered out without appreciable loss in output power from the generator. Thus, the solid state microwave generator of this invention, using a single transistor, has substantial advantages over the prior art solid state generators.

Briefly, the solid-state microwave generator of this invention comprises:

(a) A transistor having an emitter, a base, a collector, and a low collector-base time constant;

(b) A first tuning means coupling the base to a point of substantially zero R.-F. potential, said first tuning means being adapted to tune the base circuit including the base and the first tuning means to parallel resonance at a predetermined frequency, and at the same time adapted to tune the base circuit to substantially zero R.-F. impedance at least one integral multiple of the predetermined frequency;

(c) A second tuning means coupling the emitter to a point of substantially zero R.-F. potential, the second tuning means being adapted to tune the emitter circuit including the emitter and the second tuning means to parallel resonance at the predetermined frequency;

(d) A third distributed tuning means coupling the collector to a point of substantially zero R.-F. potential, the third distributed tuning means being adapted to tune the collector circuit including the collector and the third tuning means to parallel resonance at the integral multiple of the predetermined frequency;

(e) Input terminals for applying a fixed D.-C. operating voltage to the transistor; and (f) An output terminal coupled to the collector from which substantial power may be derived at an integral multiple of the predetermined frequency.

The generator of this invention is thus a compact microwave generator providing power output at frequencies such as 1 to 3 Giga cycles (Gc.). Due to the inherent reliability and long life of transistors, the solid-state generator is a substantial improvement over Klystron tubes or other vacuum tube generators used in the past. The simplicity and compactness of the generator of this invention, using only a single transistor, advances the art significantly towards the wide-spread use of solid-state microwave generators as opposed to vacuum tube generators.

The invention will be more fully understood from the more detailed description which follows, referring to the drawings in which.

Figure 1:
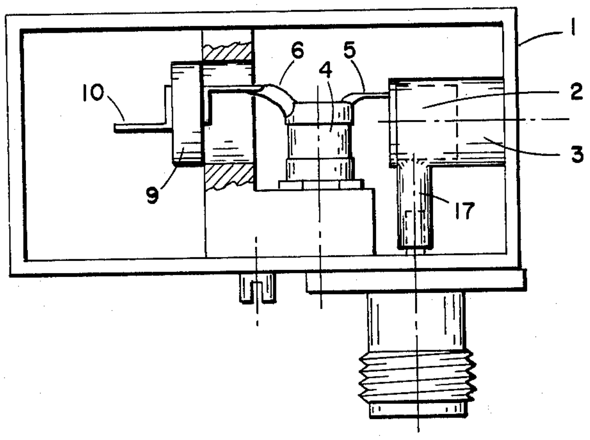
FIG. 1 is a side elevation view, partially broken away in section, showing the solid-state microwave generator of this invention.
Figure 2:
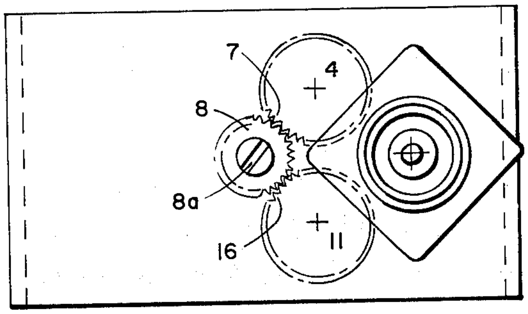
FIG. 2 is a bottom view of the generator of this invention, showing in detail the mechanical coupling of the tuning means for the emitter and base circuits.
Figure 3:
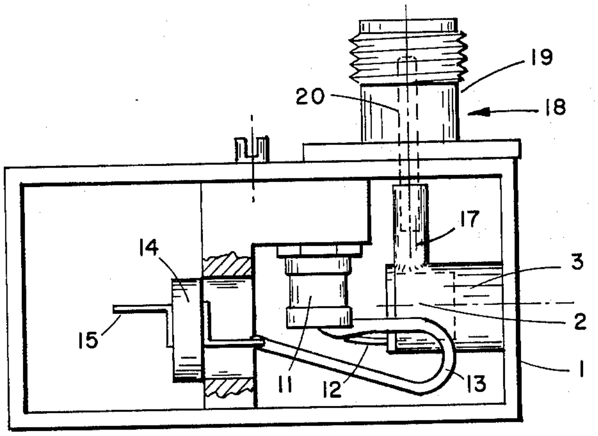
FIG. 3 is a side elevation view showing the opposite side of the device from that shown in FIG. 1.

Referring to FIGS. 1, 2, and 3, a preferred embodiment of the device of this invention is structurally illustrated. The components are housed in a rectangular enclosure 1 which is closed at the bottom, top, and two ends, and open at both sides. It is possible, if desired, to enclose the sides of the device as well to form a completely enclosed structure. This would have the advantage of preventing a certain amount of output radiation through the exposed sides.

The heart of the generator of this invention is transistor 2 mounted in stub 3 and enclosure 1. The transistor is a conventional semiconductor device having an emitter, a base, and a collector. The essential parameter of the transistor for operation in this invention is a low collector-base time constant. This time constant should be less than about 20 $\mu\mu$sec., preferably less than about 15 $\mu\mu$sec. Devices having such a time constant are readily obtainable. For example, Fairchild Semiconductor, a division of Fairchild Camera & Instrument Corp., markets a device under the product number 2N2884 which is satisfactory for this invention. However, many other devices may also be used which are available from Fairchild and other semiconductor manufacturers.

A first tuning means 4 serves to couple the base of transistor 2 through lead 5 to a point of substantially zero R.-F. potential. The first tuning means, including variable capacitor 4, is adapted to tune the base circuit of transistor 2, including the base of transistor 2 and the tuning means itself, to parallel resonance at a predetermined frequency. At the same time, the base tuning means is adapted to tune the base circuit to substantially zero-R.-F. impedance at at least one integral multiple of the predetermined frequency. In some applications, one multiple is sufficient; in others, the R.-F. impedance is zero at a plurality of integral multiples of the predetermined frequency. The particulars of the choice will be discussed later.

As best seen in FIG. 2, variable capacitor 4 has a toothed circular base 7 which is coupled to a separate tuning gear 8. Gear 8 has a screw-driver insert 8*a*. By turning gear 8, such as with a screw-driver, teeth 7 are rotated, causing the capacity of variable capacitor 4 to be changed. The change of this capacity changes the frequency of the base circuit. Thus, gear 8 can be rotated to tune the base circuit to parallel resonance at the predetermined frequency and to tune the base circuit to substantially zero R.-F. impedance at at least one integral multiple of said predetermined frequency. The base circuit includes the base of transistor 2, lead wire 5, variable capacitor 4, lead wire 6, and feed-through capacitor 9. The circumference of feed-through capacitor 9 represents a point of substantially zero R.-F. potential.

Note particularly that lead 6 has been thickened. This thickening reduces the inductance of lead 6. This inductance is an appreciable factor in making up the resonant frequency of the base circuit. Although the value of the inductance is substantially fixed, the overall circuit R.-F. impedance can be varied by adjusting tuning capacitor 4 in order to obtain the necessary impedances at the required frequencies.

If desired, the lumped parameters of the base circuit, including variable capacitor 4, may be replaced by distributed parameters. Distributed parameters and their application will be discussed more fully later in connection with the collector circuit.

Referring to FIGS. 2 and 3, a second tuning means, including variable capacitor 11, leads 12 and 13, and feed-through capacitor 14 couple the emitter of transistor 2 to a point of substantially zero R.-F. potential. This point is the point where lead 15 passes through feed-through capacitor 14. This second tuning means is adapted to tune the emitter circuit, including the emitter and the second tuning means itself, to parallel resonance at the predetermined frequency. Looped lead 13, as shown, contributes inductance to the emitter circuit. The combined circuit, including the emitter, leads 12 and 13, and variable capacitor 11 contribute the circuit parameters which tune the emitter circuit to parallel resonance at the predetermined frequency.

Note in FIG. 2 that capacitor 11 has teeth 16 at the periphery of its base member. These teeth are coupled to tuning gear 8. Since both the emitter and base circuits are tuned to parallel resonance at the predetermined frequency, the tuning of both circuits may be simultaneously accomplished by a single tuning means. By rotating tuning gear 8, both tuning capacitors 4 and 11 may be tuned simultaneously until the desired conditions are obtained. This tandem connection substantially facilitates tuning the generator of this invention.

As with the base tuning means, the lumped parameters of the emitter tuning means may be replaced by a distributed tuning means, as discussed below.

A third distributed tuning means is employed in the invention. This third tuning means is coupled to the collector of transistor 2. It includes the resonant stub 3 and enclosure 1 containing transistor 2, and connector 17. The connection of stub 3 with enclosure 1 couples the collector of transistor 2 to a point of substantially zero R.-F. potential. The third distributed tuning means is adapted to tune the collector circuit, including the collector and the third tuning means itself, to parallel resonance at an integral multiple of the predetermined frequency. It also acts as a single element bandpass filter, used to remove the predetermined frequency from the output of the generator.

In the preferred embodiment of the invention shown in FIGS. 1, 2, and 3, the transistor is mounted directly within stub 3 and enclosure 1. Such a mounting provides direct coupling between the collector of transistor 2 and the line. However, if desired, alternative means of coupling may be employed other than the preferred direct coupling illustrated.

The preferred mounting of transistor 2 within stub 3, however, is helpful in the operation of the transistor. Stub 3 is preferably a cylinder of heat conductive metal, such as copper, surrounding the transistor can. This cylinder directly attached to the transistor serves to dissipate heat. The inside diameter of the cylinder is selected so the transistor can fit snugly inside, as shown in FIGS. 1 and 3. This snug fitting provides intimate contact with the transistor so that heat generated in the transistor during operation may be dissipated. The dissipation of heat is very important because undue heating of the transistor will cause a change in its operating characteristics.

The length of stub 3, along with the characteristics of the transistor itself, determines the resonant frequency of the cavity. This length is selected according to principles well known in the art to obtain the desired resonant output frequency. The outside diameter of stub 3 and the inside dimensions of enclosure 1 along with the impedance of the transistor, determines the basic output impedance of the oscillator.

Resonant stub 3 serves to isolate the collector of transistor 2 from "A.-C. ground," or as it is generally referred to herein, "a point of substantially zero R.-F. potential." Such isolation allows the can of transistor 2 to be connected to D.-C. ground (i.e., enclosure 1) without impairing the power output of the generator.

The collector tuning, accomplished as a result of the parameters of stub 3, eliminates the need for a separate collector tuning element. Stub 3 may thus be considered "distributed" tuning means, which couples the collector to a point of substantially zero R.-F. potential. This distributed tuning means is adapted to tune the collector circuit, including the collector of transistor 2 and the tuning means itself, to parallel resonance at an integral multiple of a predetermined frequency. As discussed above, a similar distributed tuning means may, if desired, be substituted for the lumped parameter tuning means, described above, in connection with the base and emitter circuits.

One advantage of the distributed tuning means represented by cavity 3 is that the parameters can be carefully controlled. Bypass and tuning capacitors are eliminated. Therefore, the impedance of the distributed tuning means is independent of the inherent inductance of any capacitors. The details of the operation of cavity 3 will be explained more fully in connection with the explanation of the operation of the generator as a whole.

The third distributed tuning means may, if desired, include multi-element bandpass filter. Such a multi-element bandpass filter may take the form of a strip-line filter, such as an interdigital-line or comb-line filter, or a coaxial line filter. These filters are well known in the art so that further description is not believed necessary in this specification. These multi-element band-pass filters are designed to pass the desired multiple of the predetermined frequency (the output frequency), and at the same time to reject the predetermined frequency itself as well as all undesired harmonics thereof. Although not a necessary part of the invention, when used, these additional multi-element filters serve as a part of the third tuning means.

Input terminals are provided for applying a fixed D.-C. operating voltage to the transistor. These input terminals 10 and 15 are coupled across the emitter-base junction of the transistor. Terminal 10 is coupled to the base of transistor 2, terminal 15 to the emitter, and enclosure 1 to the collector.

The output terminal 18 is shown as a coaxial line with outer portion 19 and inner portion 20 (shown dotted). Substantial power may be derived from output terminal 18 at the output frequency, which is an integral multiple of the predetermined frequency of the generator.

Figure 4:
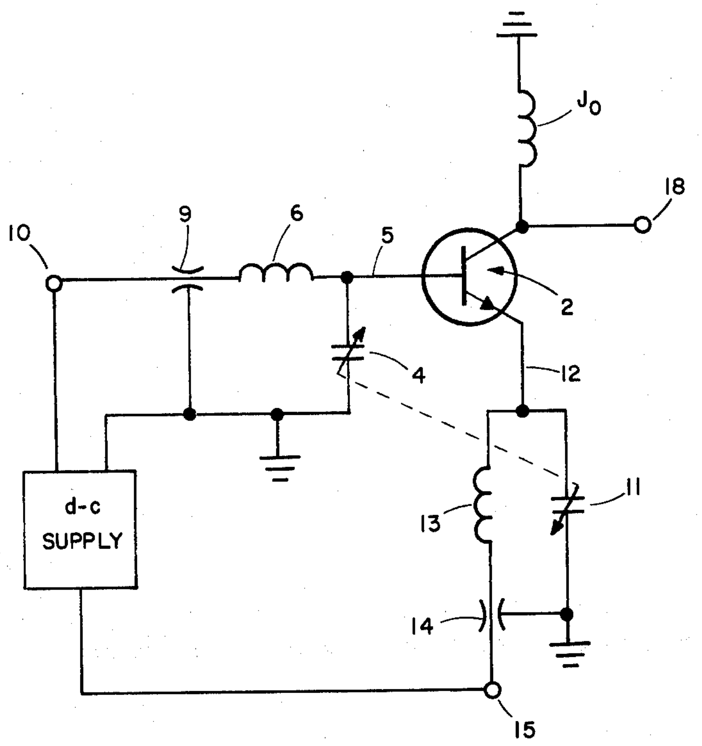
FIG. 4 is a schematic circuit diagram approximating the generator of this invention.

Although not exact, the schematic analogy of the generator of a preferred embodiment of this invention is shown in FIG. 4. A D.-C. voltage is applied through inductors 6 and 13 (which are short circuits to D.-C.) to the base and emitter, respectively, of transistor 2. To obtain the most output power from the generator at the desired multiple of the predetermined frequency, the base circuit, including inductor 6 and variable capacitor 4, is not only tuned to parallel resonance at the predetermined frequency, but is also tuned to substantially zero R.-F. impedance at at least one integral multiple of said predetermined frequency. This multiplied frequency may or may not be the same as the output frequency. The desired output multiplier of the generator (e.g., whether it is used as a doubler, tripler, quadrupler, etc.), governs whether the base circuit will be tuned to zero R.-F. impedance at the output frequency, or at some other frequency or frequencies, or both. The desired frequency at which to tune the base circuit is well known in the art for most output frequency multiples. For a clear explanation of how the choice of base frequencies is made, the reader is referred to Penfield and Rafuse Varactor Applications, MIT Press, 1962. The emitter circuit is also tuned to parallel resonance at the predetermined frequency. This tuning is accomplished by adjusting variable capacitor 11.

The value of the inductor shown as $J_0$ in the schematic of FIG. 4 is determined by the parameters of stub 3 and enclosure 1 (referring to FIGS. 1 and 3). These parameters tune the collector circuit of transistor 2 to parallel resonance at an integral multiple of the predetermined frequency, which is the output frequency of the generator. For example, if the predetermined frequency is $f_0$, the output circuit may be tuned to $2f$ (for a doubler), $3f_0$ (for a tripler), and so on. The parameters of stub 3 and enclosure 1 (referring to FIGS. 1 and 3), as well as any externally connected filters, may be adjusted by one skilled in the art to achieve the desired distributed parameters to obtain the proper frequency multiplication.

The shields of feed-through capacitors 9 and 14 are connected to ground, as shown. Similarly, inductor $J_0$ is terminated at ground (ground being a point of substantially zero R.-F. potential). The output signal at the multiplied frequency is obtained at terminal 18.

The generator of this invention can be adapted for a wide variety of mircrowave bands. For example, L-band and S-band are particularly suitable. Tuning gear 8, shown in FIG. 2, is used to tune the generator of the preferred embodiment of the invention through an output frequency range from about 1080 to 1280 mc. With a higher frequency transistor, the preferred embodiment can be tuned from 2.7 to 3.2 Gc. (using the third multiple of the predetermined frequency). When used to drive a varactor multiplier to obtain higher output frequencies, a substantial reduction in the required multiplication factor is realized.

The device has the advantages of low power drain and compactness not found in conventional tube-type generators. It may be used as a local oscillator in radar or in communications systems, or as a low-level traveling wave tube driver.

Although only a preferred embodiment of the device has been described in detail, the specific description and drawings are not intended to limit the scope of the invention, as many modifications apparent to the skilled practioner are believed within that scope. The invention is only intended to be limited as specifically stated in the claims which follow.

What is claimed is:

1. A solid-state microwave generator, comprising:

(a) a transistor having an emitter, a base, a collector, and a low collector-base time constant;

(b) a first tuning means coupling said base to a point of substantially zero R.-F. potential, said first tuning means being adapted to tune the base circuit including said base and said first tuning means to parallel resonance at a predetermined frequency, and at the same time adapted to tune said base circuit to substantially zero R.-F. impedance at at least one integral multiple of said predetermined frequency;

(c) a second tuning means coupling said emitter to a point of substantially zero R.-F. potential, said second tuning means being adapted to tune the emitter circuit including said emitter and said second tuning means to parallel resonance at said predetermined frequency;

(d) a third distributed tuning means coupling said collector to a point of substantially zero R.-F. potential, said third distributed tuning means being adapted to tune the collector circuit including said collector and said third tuning means to parallel resonance at said integral multiple of said predetermined frequency;

(e) input terminals for applying a fixed D.-C. operating voltage to said transistor; and (f) an output terminal coupled to said collector from which substantial power may be derived at said integral multiple of said predetemined frequency.

2. A solid-state microwave generator, comprising:

(a) a transistor having an emitter, a base, and a collector, and a low collector-base time constant;

(b) a first tuning means coupling said base to a point of substantially zero R.-F. potential, said first tuning means being adapted to tune the base circuit including said base and said first tuning means to parallel resonance at a predetermined frequency, and at the same time adapted to tune said base circuit to substantially zero R.-F. impedance at at least one integral multiple of said predetermined frequency;

(c) a second tuning means coupling said emitter to a point of substantially zero R.-F. potential, said second tuning means being adapted to tune the emitter circuit, including said emitter and said second tuning means to parallel resonance at said predetermined frequency;

(d) a third distributed tuning means coupling said collector to a point of substantially zero R.-F. potential, said third distributing tuning means being adapted to tune the collector circuit including said collector and said third tuning means to parallel resonance at an integral multiple of said predetermined frequency, said transistor being mounted within said coaxial line so as to provide direct coupling between said collector and said line;

(e) input terminals for applying a fixed D.-C. operating voltage to said transistor; and (f) an output terminal coupled to said collector from which substantial power may be derived at said integral multiple of said predetermined frequency.

3. A solid-state microwave generator, comprising:

(a) transistor having an emitter, a base, and a collector, and a low collector-base time constant;

(b) a first time means coupling said base to a point of substantially zero R.-F. potential, said first tuning means being adapted to tune the base circuit including said base and said first tuning means to parallel resonance at a predetermined frequency, and at the same time adapted to tune said base circuit to substantially zero R.-F. impedance at at least one integral multiple of said predetermined frequency;

(c) a second tuning means coupling said emitter to a point of substantially zero R.-F. potential, said second tuning means being adapted to tune the emitter circuit, including said emitter and said second tuning means to parallel resonance at said predetermined frequency.

(d) a third distributed tuning means coupling said collector to a point of substantially zero R.-F. potential, said third distributor tuning means being adapted to tune the collector circuit including said collector and said third tuning means to parallel resonance at an integral multiple of said predetermined frequency, said third tuning means including a strip-line bandpass filter tuned to pass said integral multiple of said predetermined frequency;

(e) input terminals for applying a fixed D.-C. operating voltage to said transistor; and (f) an output terminal coupled to said collector from which supbstantial power may be derived at said integral multiple of said predetermined frequency.

4. A solid-state microwave generator, comprising:

(a) a transistor having an emitter, a base, and a collector, and a low collector-base time constant;

(b) a first tuning means coupling said base to a point of substantially zero R.-F. potential, said first tuning means being adapted to tune the base circuit including said base and said first tuning means to parallel resonance at a predetermined frequency, and at the same time adapted to tune said base circuit to substantially zero R.-F. impedance at at least one integral multiple of said predetermined frequency;

(c) a second tuning means coupling said emitter to a point of substantially zero R.-F. potential, said second tuning means being adapted to tune the emitter circuit, including said emitter and said second tuning means to parallel resonance at said predetermined frequency;

(d) a third distributed tuning means coupling said collector to a point of substantially zero R.-F. potential, said third distributed tuning means being adapted to tune the collector circuit including said collector and said third tuning means to parallel resonance at an integral multiple of said predetermined frequency, said third tuning means being a coaxial line filter tuned to pass said integral multiple of said predetermined frequency;

(e) input terminals for applying a fixed D.-C. operating voltage to said transistor; and (f) an output terminal coupled to said collector from which substantial power may be derived at said integral multiple of said predetermined frequency.

5. A solid-state microwave generator, comprising:

(a) a transistor having an emitter, a base, and a collector, and a low collector-base time constant;

(b) a first tuning means coupling said base to a point of substantially zero R.-F. potential, said first tuning means being adapted to tune the base circuit including said base and said first tuning means to parallel resonance at a predetermined frequency, and at the same time adapted to tune said base circuit to substantially zero R.-F. impedance at at least one integral multiple of said predetermined frequency, said first tuning means including a variable capacitor;

(c) a second tuning means coupling said emitter to a point of substantially zero R.-F. potential, said second tuning means being adapted to tune the emitter circuit, including said emitter and said second tuning means to parallel resonance at said predetermined frequency, said second tuning means including a variable capacitor;

(d) a third distributed tuning means coupling said collector to a point of substantially zero R.-F. potential, said third distributed tuning means being adapted to tune the collector circuit including said collector and said third tuning means to parallel resonance at an integral multiple of said predetermined frequency;

(e) input terminals for applying a fixed D.-C. operating voltage to said transistor, said input terminals being coupled across the emitter-base junction of said transistor; and (f) an output terminal coupled to said collector from which substantial power may be derived at said integral multiple of said predetermined frequency.

6. A solid-state microwave generator, comprising:

(a) a transistor having an emitter, a base, and a collector, and a low collector-base time constant of less than about 20 $\mu\mu$sec.;

(b) a first tuning means coupling said base to a point of substantially zero R.-F. potential, said first tuning means being adapted to tune the base circuit including said base and said first tuning means to parallel resonance at a predetermined frequency, and at the same time adapted to tune said base circuit to substantially zero R.-F. impedance at at least one integral multiple of said predetermined frequency, said first tuning means including a variable capacitor;

(c) a second tuning means coupling said emitter to a point of substantially zero R.-F. potential, said second tuning means being adapted to tune the emitter circuit, including said emitter and said second tuning means to parallel resonance at said predetermined frequency, said second tuning means including a variable capacitor, said first and second tuning means being coupled together so that they may be tuned in tandem;

(d) a third distributed tuning means coupling said collector to a point of substantially zero R.-F. potential, said third distributed tuning means being adapted to tune the collector circuit including said collector and said third tuning means to parallel resonance at an integral multiple of said predetermined frequency;

(e) input terminals for applying a fixed D.-C. operating voltage to said transistor; and (f) an output terminal coupled to said collector from which substantial power may be derived at said integral multiple of said predetermined frequency.

7. A solid-state microwave generator, comprising:

(a) a transistor having an emitter, a base, and a collector, and a low collector-base time constant of less than about 20 $\mu\mu$sec.;

(b) a first tuning means coupling said base to a point of substantially zero R.-F. potential, said first tuning means being adapted to tune the base circuit including said base and said first tuning means to parallel resonance at a predetermined frequency, and at the same time adapted to tune said base circuit to substantially zero R.-F. impedance at at least one integral multiple of said predetermined frequency, said first tuning means including a variable capacitor;

(c) a second tuning means coupling said emitter to a point of substantially zero R.-F. potential, said second tuning means being adapted to tune the emitter circuit, including said emitter and said second tuning means to parallel resonance at said predetermined frequency, said second tuning means including a variable capacitor, said first and second tuning means being coupled together so that they may be tuned in tandem;

(d) a third distributed tuning means coupling said collector to a point of substantially zero R.-F. potential, said third distributed tuning means being adapted to tune the collector circuit including said collector and said third tuning means to parallel resonance at an integral multiple of said predetermined frequency, said transistor being mounted within said coaxial line so as to provide direct coupling between said collector and said line;

(e) input terminals for applying a fixed D.-C. operating voltage to said transistor, said input terminals being coupled across the emitter-base junction of said transistor; and (f) an output terminal coupled to said collector from which substantial power may be derived at said integral multiple of said predetermined frequency.

No references cited.

ROY LAKE, *Primary Examiner.*